July 19, 1966 T. R. TRILLING 3,262,066

AMPLIFIER CIRCUIT

Filed June 28, 1962

INVENTOR.
THEODORE R. TRILLING

BY [signature]
AGENT

United States Patent Office 3,262,066
Patented July 19, 1966

3,262,066
AMPLIFIER CIRCUIT

Theodore R. Trilling, 15 Hunt Road, Levittown, Pa.

Filed June 28, 1962, Ser. No. 206,107
4 Claims. (Cl. 330—69)

The invention described herein may be manufactured and used by or for the Government of the United States of America for governmental purposes without the payment of any royalties thereon or therefor.

The present invention relates to differential amplifiers and more particularly to direct current, directly coupled differential amplifiers.

In constructing differential amplifiers, the D.C. parameters of the transistors or vacuum tubes used are normally matched at the desired operating point. However, it is not possible normally to select transistors or vacuum tubes whose D.C. characteristics are exactly the same at more than one operating point or at different operating temperatures. Thus, when the transistors or tubes in a differential amplifier deviate from the operating point at which their parameters are matched, the signal voltage drifts and the amplifier becomes unbalanced. In an array of direct coupled D.C. differential amplifiers this drift is compounded and may result in the differential amplifiers' operating point going completely out of the linear portion of their operation. In any event, such shift may limit the voltage swings in the output to values considerably smaller than permitted if the amplifier were operating at the original operating point.

A differential amplifier itself has a natural tendency to prevent shift of the operating point by canceling any drift in the amplifier. However, for any one of a number of reasons, whether it is in the input or due to the inherent characteristics of the amplifiers, there may still be a change in the operating point caused by common-mode voltage effects. Such a change in operating point may, of course, be amplified by a direct coupled amplifier. Where there are two or more differential amplifiers cascaded, it is quite possible that the final pair of amplifiers in the final differential amplifier would be operating outside of the linear region due to the common-mode voltage. If the amplifier is not operating outside the linear region, it may be so close to going outside of the linear region of operation as to limit to a considerable extent the voltage swings in the output to values much less than that permitted by the operating point at which the amplifiers were designed to operate.

Thus, regardless of how well the individual transistors may be matched as to their characteristics and parameters for one operating point, unbalance may result from ambient temperature changes, variations in inputs as well as common-mode voltage input, all of which may result in a common-mode voltage of such amplitude as to cause a differential amplifier to deviate from its original operating point. Although the common-mode voltage variation does not appear in the output as such, it may cause the differential amplifier or the output differential amplifier in a cascaded series to swing outside the linear area of operation, thus curtailing the use of the differential amplifier in many cases.

Various techniques are in use today to compensate for common-mode shifts in operating points of differential amplifiers due to ambient temperature change, changes in power supply or variations in circuit parameter values. Among these are resistor type compensation circuits, thermal coupling, and thermal elements for controlling the thermal variations.

In some instances a D.C. feedback circuit is used for stabilizing the operating point which may shift with changes in temperature. Other means for preventing shift of the operating point due to the common-mode voltage involves a rejection of the common-mode input signal as by varying a resistive element in the cathode of the input stage.

The present invention contemplates a cascaded differential amplifier double ended or single ended in the input and having a double ended output circuit wherein as much of the common-mode signal as possible that appears in the output stage is fed back to the input stage to control a constant current device therein to nullify any variations in the operating point due to common-mode voltage.

Therefore, it is an object of the present invention to provide a double ended input-output differential amplifier wherein undesired common-mode voltages accompanying the input signal are prevented from causing a shift in the operating point of the differential amplifier.

Another object of the present invention is to provide a direct current amplifier comprising a plurality of direct coupled differential amplifiers in which the common-mode voltage appearing in the output stage is fed back to the input stage for the purpose of preventing shift in the operating point of the amplifier.

A further object of the present invention is to provide a single ended input double ended output differential amplifier which substantially eliminates variations in operating point by compensating for the effects of common-mode voltages caused by internal variations in the characteristics of the circuit elements involved.

A still further object of the present invention is to provide a direct current amplifier comprising a plurality of direct coupled differential amplifiers wherein undesired common-mode voltages appearing in the output stage due either to common-mode voltage associated with a differential input or to inherent characteristics of the circuitry elements involved are made ineffective to cause shift of the normal operating point by accurately controlling current flow in the input stage according to variations in common-mode voltage appearing in the output stage.

Other objects and many of the attendant advantages of this invention will be readily appreciated as the same becomes better understood by reference to the following detailed description when considered in connection with the accompanying drawings, in which like reference numerals designate like parts throughout the figures thereof and wherein.

Figure 1:
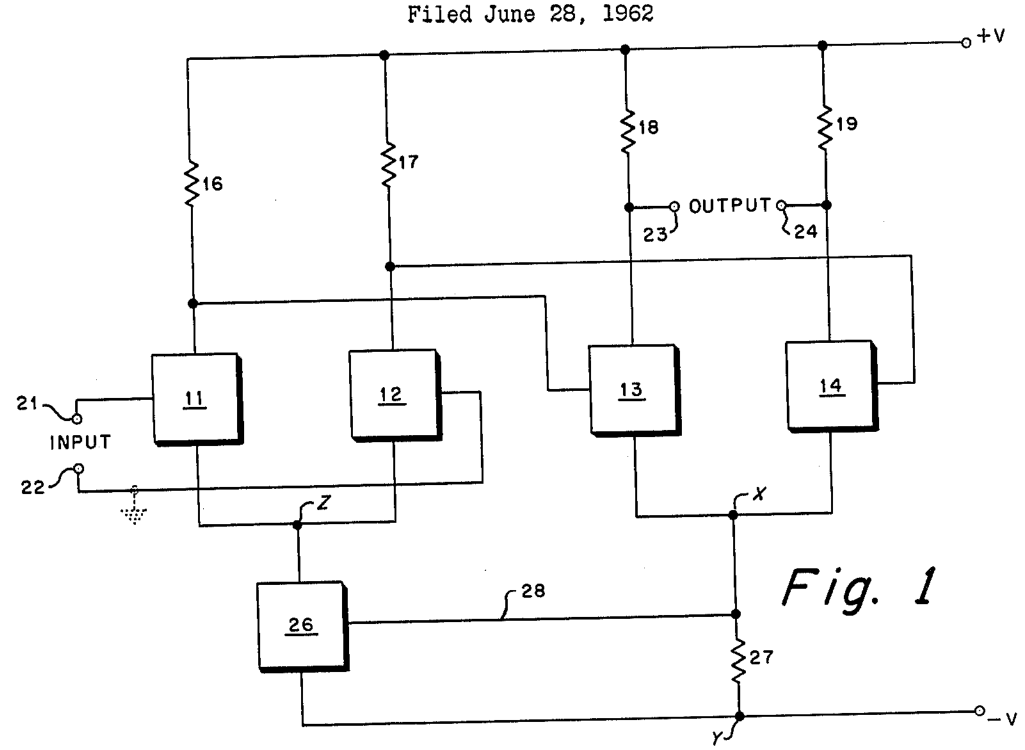
FIG. 1 shows in block diagram form the preferred embodiment of the present invention.

Referring now in detail to FIG. 1, there is shown a double ended input-output amplifier comprising two direct coupled differential amplifiers. Amplifier devices 11 and 12 make up the first or input differential amplifier. The second or output differential amplifier comprises amplifier devices 13 and 14. Connected to the positive side of a source of power indicated by +V and the load connecting element of each of the amplifier devices 11, 12, 13 and 14 (in the case of vacuum tubes being the plate, and in the case of transistors being the collector) are load resistors 16, 17, 18 and 19, respectively. The control element of device 13 is directly coupled to the output of amplifier device 11 at a point between load resistor 16 and amplifier device 11. Likewise, the control element of amplifier device 14 is directly coupled to the output of amplifier device 12.

The differential amplifier which comprises amplifier devices 11 and 12 is provided with a double ended input wherein terminal 21 is connected to the control element of amplifier device 11 and terminal 22 is connected to the control element of amplifier device 12. The double ended input of this differential amplifier may be conveniently transformed into a single ended input merely by grounding one of the input conductors as shown by dotted lines in FIG. 1.

The output from the differential amplifier comprising amplifier devices 13 and 14 is tapped off load resistors 18 and 19 as at terminals 23 and 24.

The cathode or emitter (depending whether vacuum tubes or transistors are used) are connected in common to a constant current device 26 which may be any active element with constant current characteristics.

Element 26 is interposed between the input differential amplifier and the negative side of the power supply indicated by —V. The cathodes or emitters of amplifier devices 13 and 14 are connected in common to the negative portion of the power supply through a resistor 27. Between the common connection of amplifier devices 13 and 14 and resistor 27 an electrical conductor is connected to constant current device 26.

When a D.C. voltage having one amplitude is provided as an input to terminal 21 and a second D.C. voltage of another amplitude is provided as an input to terminal 22, the difference between the two amplitudes of the two input voltages is amplified and appears between terminals 23 and 24 in the output differential amplifier as a potential difference. Even though a common-mode voltage was introduced at the inputs 21 and 22 as by being superimposed on the D.C. input signals, the output at 23 and 24 would be relatively unaffected. However, this common-mode voltage causes the operating point of the first or input differential amplifier to change, which change in operating voltage is compounded by amplification in output differential amplifier. Such may well result in one or more of the differential amplifiers having an operating point at a voltage outside its prescribed limits of linearity or unduly close to those limits.

Common-mode voltages and variations thereof appear across resistor 27. The voltage across resistor 27 which varies in accordance with the common-mode voltage is connected to the control element of constant current device 26 via conductor 28. The amount of current that is generated in constant current device 26 is directly controlled by the common-mode voltage across resistor 27. Thus, by adjusting the constant current device to change the common-mode current around the amplifier until the voltage across resistor 27 returns to normal the effects of common-mode voltages or variations thereof are eliminated. Such an arrangement is called common-mode feedback. Thus, by using common-mode feedback between a common-mode point in the output to a common-mode point in the input, the operation of all differential amplifiers is stabilized at the operating points dictated by design or other considerations for which they were designed.

Resistors may be inserted in the line connecting amplifier devices 11 and 12 to constant current device 26 in order to match amplifier gains and to improve stability. The amplifier devices 11, 12, 13, and 14 are shown as being directly coupled although resistors may be inserted in the coupling line as well as some other type of coupling element.

A.C. coupling may be used in the input as, for example, by using input capacitors when it is not desired or necessary to go down to zero frequency (D.C.). This, of course, is feasible when the input impedance of the amplifier device is high enough to make capacitance coupling practical at the lowest desired frequency. Furthermore, ordinary local feedback may be used between output and input to further stabilize the amplifiers and raise input impedance.

The above described circuit is feasible where even numbers of differential amplifiers, that is, 2, 4, 6, etc., are used. When odd numbers of differential amplifiers are used, a phase inverter must be inserted between resistor 27 and constant current device 26, thus making the common-mode feedback negative.

Figure 2:
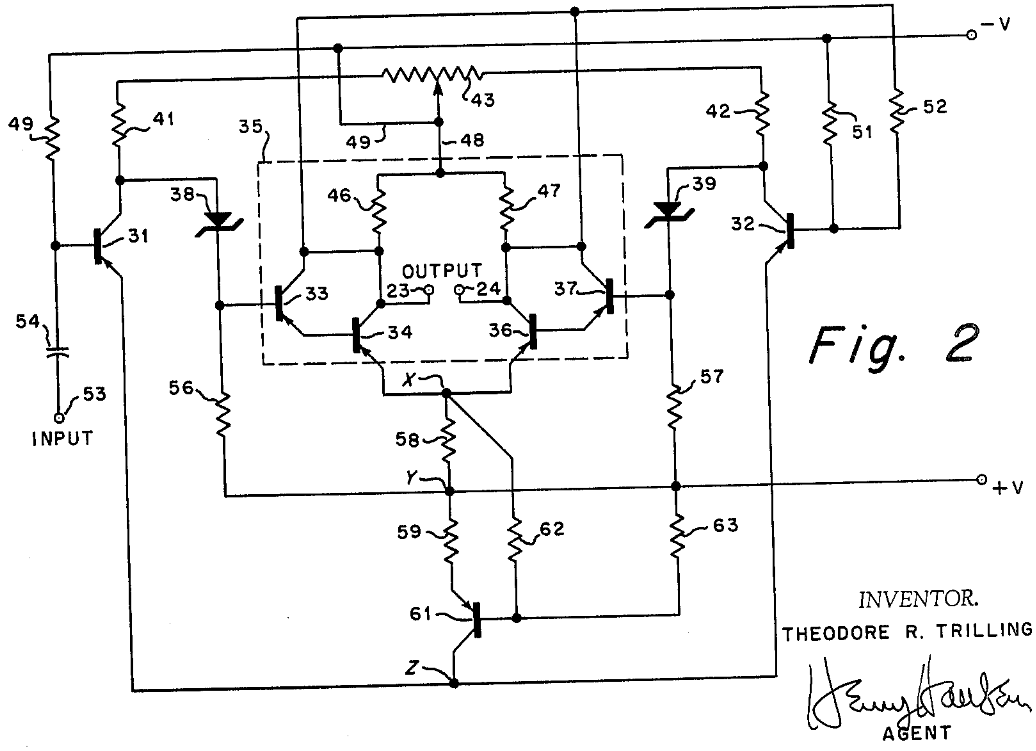
FIG. 2 shows in schematical representation an amplifier embodying the principle of this invention for non-differential inputs having frequencies other than zero.

Referring now more particularly to FIG. 2, there is shown an amplifier embodying the principle of the present invention for amplifying signals of a very low frequency (such as generated by the slow variation from a norm of a signal recorded in a strip chart recorder). The amplified signal is provided in the output differential amplifier as a potential difference between output terminals 23 and 24. The circuit is essentially a direct coupled type amplifier which is typical of the type used in the amplification of signals of very low frequencies. However, the circuit of the present invention employs the principle of common-mode feedback in such a manner as to substantially improve instability due to common-mode effects.

The amplifier in FIG. 2 is shown as a single ended amplifier but may be used as a double ended input type amplifier simply by applying separate signals to the bases of the input transistors.

Transistors 31 and 32 together form a differential amplifier which in this representation is the input differential amplifier. The four transistors 33, 34, 36 and 37 enclosed by dotted lines form differential amplifier 35, which is the output differential amplifier.

The emitter of transistor 33 is connected to the base of transistor 34. The respective collectors of transistors 33 and 34 are connected in common. This is known as the Darlington connection of transistors and results in the compounding of signals applied to the base of transistor 33. Transistors 36 and 37 are connected similarly as 33 and 34. Transistors 33 and 34 form one side of differential amplifier 5 while transistors 36 and 37 form the other side of differential amplifier 35. The collector of transistor 31 is connected to the base of transistor 33 through avalanche diode 38 which provides the voltage drop necessary to allow proper voltages across the input transistor. The collector of transistor 32 is connected to the base of transistor 37 through avalanche diode 39 in a similar fashion. Load resistors 41 and 42 are connected to respective ends of potentiometer resistor 43. Load resistors 46 and 47 are connected in common through wiper arm 48 to potentiometer resistor 43. Conductor 49 electrically connects the wiper arm 48 to the negative side of a D.C. power source. This connection provides for balancing or zeroing each side of the amplifier at zero signal as well as provides operating power to the two differential amplifiers.

Resistors 49 and 51 are connected to the bases of transistors 31 and 32, respectively. The resistors 49 and 51 are also connected in common to the negative source of voltage thereby providing bias for transistors 31 and 32..

The collectors of transistors 33 and 34 are connected in common with the collectors of transistors 36 and 37 to the base of transistor 32 through resistor 52.

The input to the amplifier of FIG. 2 is single ended and a low frequency input signal is applied to the base of transistor 31 through coupling capacitor 54 via input terminal 53.

The emitters of transistors 31 and 32 are connected in common to the collector of transistor 61 at point Z. The bases of transistors 33 and 37 are connected to point Y through resistors 56 and 57, respectively. The positive side of the voltage power source is also connected to point Y. Resistor 58, which is equivalent to resistor 27 in FIG. 1, is connected between points X and Y as shown in the drawing. Point Y is connected to transistor 61 through resistor 59. Resistor 59 is a nonlinear type of resistor and is used to compensate for temperature ambient variations. Transistor 61 is a constant current generator and has its collector connected to point Z. Point X, the junction point of the emitters of transistors 34 and 36, is connected to the base of transistor 61 through resistance 62. Resistor 62 is a feedback resistor. Resistor 63, which is connected between the base of transistor 61 and the positive source of voltage, is a stabilizing resistor for transistor 61.

The output of the amplifier of FIG. 2 is taken off of the collectors of transistors 34 and 36 as at terminals 23 and 24 which are equivalent to the terminals 23 and 24 in FIG. 1.

The description of the circuit in FIG. 2 is as follows: When the signal at the base of transistor 31 is positive it causes the emitter current thereof to increase. Since constant current generator 61 limits the amount of current that can flow through the input differential amplifier, the current through transistor 32 must decrease. The collector signals of transistors 31 and 32 are then out of phase and appear at the collector load resistors 41 and 42, respectively. The signals are then coupled to the second differential amplifier from the collectors of transistors 31 and 32 to the bases of transistors 33 and 37 through avalanche diodes 38 and 39, respectively. Resistors 56 and 57 serve to draw proper currents through the avalanche diodes 38 and 39.

The signals which are applied to the bases of the differential amplifier 35 are therein compounded due to the above discussed Darlington connection. These transistors together provide a push-pull type of operation and a differential signal is present at the output terminals 23 and 24.

Point X, which is the junction of the emitters of differential amplifier 35, is used as the common-mode voltage pickoff point. Thus, if a common-mode signal is present at this point, it appears as a voltage across resistor 58 and is coupled via feedback resistor 62 to the base of constant current generator transistor 61 whose current is changed in a direction to reduce the current of the input transistors 31 and 32. This reduction in current is coupled to the differential amplifier 35 where it appears at the emitters of the proper polarity to cancel out the voltage across resistor 58 due to common-mode. In this manner the common-mode voltage substantially disappears.

Since the operating points of the transistors are maintained at a constant proportional to one over the common-mode open loop gain, any variations of the common-mode type are reduced accordingly, whether due to thermal, power supply, or aging effects, etc. Any common-mode signal appearing at the input of the amplifier is not amplified at the output due to the fact that the common-mode gain of the amplifier is nearly unity, that is, the common-mode feedback approaches 100%. Thus the common-mode rejection (ratio of common-mode signal gain to push-pull signal gain at the output is quite high). The amplifier's large signal capability is maintained therefore in spite of common-mode variations or reasonable common-mode signals. The feedback loop not only controls the current generator in accordance with common-mode voltage variation but also makes transistor 61 a more perfect constant current generator by the stabilizing effects of the feedback loop.

Obviously, many modifications and variations of the present invention are possible in the light of the above teachings. It is therefore to be understood that within the scope of the appended claims, the invention may be practiced otherwise than as specifically described.

What is claimed is:

1. An amplifier circuit, comprising in combination:
first differential amplifier means,
second differential amplifier means,
first conductor means directly coupling said first differential amplifier means to said second differential amplifier means,
input terminal means connected to said first differential amplifier means,
voltage supply means,
resistor means connected between a common point of said second differential amplifier means and said voltage supply means,
constant current generating means having a first terminal connected to a common point of said first differential amplifier means and a second terminal connected to said voltage supply means,
means for applying the potential at the common point of said second amplifier means to said constant current generating means,
whereby common-mode voltage across said resistor means proportionally controls the current generated by said constant current generating means to thereby prevent shift in the operating point of the amplifier circuit due to common-mode effects.

2. An amplifier circuit, comprising in combination:
a first pair of amplifier devices having a common point of connection and forming a first differential amplifier,
a second pair of amplifier devices having a common point of connection and forming a second differential amplifier,
first conductor means directly coupling said first differential amplifier to said second differential amplifier,
input means connected to said first differential amplifier,
output means connected to said second differential amplifier providing a differential output,
voltage source means,
constant current generating means having a first terminal connected between said common point of connection of said first pair of amplifier devices and a second terminal connected to said voltage source means and having a control point controlling the operation of said current generating means,
resistor means connected between said common point of connection of said second pair of amplifier devices and said voltage source means,
means connecting said common point of connection of said second pair of amplifier devices to said control point of said constant current generating means,
whereby the current generated by said constant current generating means which is a function of the voltage across said resistor means maintains the current through said first differential amplifier at a predetermined constant amount to prevent shift in the operating point of the amplifier circuit due to common-mode effects.

3. An amplifier circuit, comprising in combination:
a first pair of transistor means, each transistor means having a base, emitter and collector forming a first differential amplifier,
a second pair of transistor means, each transistor means having a base, emitter and collector forming a second differential amplifier,
first conductor means coupling the collectors of said first differential amplifier to the bases of said second differential amplifier,
input terminal means connected to the base of one of said first pair of transistor means,
output terminal means connected to the collectors of said second pair of transistor means,
a voltage supply means,
resistor means connected between the emitters of said second pair of transistor means and said voltage supply means,
constant current generating means connected between the emitters of said first pair of transistor means and said voltage supply means,
second conductor means connected between a common point of the emitters of said second pair of transistor means, and said constant current generating means,
whereby the current generated by said constant current generating means which is a function of the voltage at the emitters of said second pair maintains the current through said first differential amplifier at a predetermined constant amount to prevent shift in the operating point of the amplifier circuit due to common-mode effects.

4. An amplifier circuit, comprising in combination:
a first pair of transistor means each having a base, emitter and collector forming a first differential amplifier;

a second pair of transistor means each having a base, emitter and collector forming a second differential amplifier;

conductor means coupling the collectors of said first differential amplifier to the bases of said second differential amplifier;

input capacitor means connected to the base of one of said first pair of transistor means;

resistor means connected between the bases of said first pair of transistor means, whereby a single low frequency signal is effective as an input to the amplifier circuit;

output terminal means connected to the collectors of said second pair of transistor means;

voltage source means;

resistor means connected between the emitters of said second pair of transistor means and said voltage source means;

third transistor means having a base, emitter and collector, said collector connected to the emitters of said first pair of transistor means and said emitter connected to said voltage source;

feedback resistor means connected between the base of said third transistor means and the emitters of said second pair of transistor means;

whereby the current flow through said third transistor means which is a function of the voltage across said resistor means causes the current through said first differential amplifier to remain at a predetermined constant amount to prevent shift in the operating point of the amplifier circuit due to common-mode effects.

References Cited by the Examiner

UNITED STATES PATENTS

| | | | |
|---|---|---|---|
| 2,779,871 | 1/1957 | Patterson. | |
| 2,796,468 | 6/1957 | McDonald | 330—69 |
| 2,883,532 | 4/1959 | Hyder | 328—173 |
| 3,003,113 | 10/1961 | MacNichol | 330—69 |
| 3,168,708 | 2/1965 | Stuart-Williams et al. | 330—69 X |

FOREIGN PATENTS

| | | |
|---|---|---|
| 1,065,882 | 9/1959 | Germany. |

ROY LAKE, *Primary Examiner.*

N. KAUFMAN, *Assistant Examiner.*